(12) United States Patent
Kim (10) Patent No.: US 8,213,252 B2
(45) Date of Patent: Jul. 3, 2012

(54) SEMICONDUCTOR MEMORY DEVICE COMPRISING SENSE AMPLIFIERS CONFIGURED TO STABLY AMPLIFY DATA

(75) Inventor: Hyung-Seuk Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 182 days.

(21) Appl. No.: 12/832,215

(22) Filed: Jul. 8, 2010

(65) Prior Publication Data

US 2011/0058435 A1    Mar. 10, 2011

(30) Foreign Application Priority Data

Sep. 4, 2009 (KR) .................. 10-2009-0083575

(51) Int. Cl.
*G11C 7/00* (2006.01)

(52) U.S. Cl. .................. 365/207; 365/205; 365/206

(58) Field of Classification Search .................. 365/207, 365/205

See application file for complete search history.

(56) References Cited

U.S. PATENT DOCUMENTS 6,111,796 A * 8/2000 Chang et al. .................. 365/196
7,242,627 B2 * 7/2007 Mizuno et al. ................ 365/203

FOREIGN PATENT DOCUMENTS

| JP | 10083677 A | 3/1998 |
| JP | 11203877 A | 7/1999 |
| KR | 1020010058380 A | 7/2001 |
| KR | 1020020055160 A | 7/2002 |
| KR | 1020050023537 A | 3/2005 |

* cited by examiner

*Primary Examiner* — Son Dinh
(74) *Attorney, Agent, or Firm* — Volentine & Whitt, PLLC (57) ABSTRACT

A semiconductor memory device adjusts a timing interval between the activation of first and second amplifiers in a sense amplifier circuit based on the distance between the sense amplifier circuit and corresponding power supply.

15 Claims, 6 Drawing Sheets

SEMICONDUCTOR MEMORY DEVICE COMPRISING SENSE AMPLIFIERS CONFIGURED TO STABLY AMPLIFY DATA

CROSS-REFERENCE TO RELATED APPLICATIONS

This application claims priority under 35 U.S.C. §119 to Korean Patent Application No. 10-2009-0083575 filed on Sep. 4, 2009, the disclosure of which is hereby incorporated by reference in its entirety.

BACKGROUND

Embodiments of the inventive concept relate generally to semiconductor memory devices. More particularly, embodiments of the inventive concept relate to a semiconductor memory device comprising sense amplifiers configured to stably amplify data on a bitline pair.

A semiconductor memory device typically comprises a memory cell array comprising plurality of memory cells. The memory cells are typically arranged in rows and columns connected to corresponding wordlines and bitlines, and the memory cells are generally programmed and read by applying appropriate voltages to selected wordlines and bitlines and/or sensing voltages on the wordlines and bitlines.

To select the wordlines and bitlines for program and read operations, the semiconductor memory device receives a memory address and decodes the address to produce a row address and a column address. The row address corresponds to one or more selected wordlines and the column address corresponds to one or more selected bitlines. A program or read operation is then performed by applying program or read voltages to the selected wordlines and bitlines.

In some semiconductor memory devices, each bitline comprises a pair of signal lines carrying signals with a voltage difference. Such a pair of lines is called a bitline pair. In some devices, the two lines in a bitline pair carry complementary signals, such as a logical '0' and a logical '1'.

A sense amplifier circuit is often used to sense and amplify the voltage difference between bit line pairs in a device. The sense amplifier typically receives a supply voltage and a ground voltage from a power supply circuit adjacent to the memory cell array. These voltages can be used to amplify the voltage difference between bitline pairs.

Bitline pairs are generally precharged to a predetermined voltage level before a sensing operation is performed by the sense amplifier circuit. Where the sensing operation is performed, the voltages on the bitline pair change in accordance with data stored in one or more memory cells being sensed. These changes on the bitlines generally cause the lines in the bitline pair to be driven to the supply voltage or the ground voltage through driving circuits or switches in the sense amplifier. These driving circuits may be implemented, for instance, by n-type and/or p-type metal oxide semiconductor (NMOS or PMOS) devices.

Unfortunately, in many devices, the driving capability of the driving circuits may vary. These variances can cause errors in sensed data, including bitline pairs with erroneously reversed polarity.

SUMMARY

Embodiments of the inventive concept provide a semiconductor memory device capable of stably amplifying data on a bitline pair irrespective of a distance between a sense amplifier circuit and a power supply.

According to one embodiment of the inventive concept, a semiconductor memory device, comprises a memory cell array, a power supply, and a controller. The memory cell array comprises a plurality of sub memory cell arrays each comprising a plurality of first memory cells connected between a plurality of first wordlines and a plurality of first bitlines, and a plurality of second memory cells connected between a plurality of second wordlines and a plurality of second bitlines, wherein the plurality of sub memory cells are arranged in a direction of the first bitlines. The memory cell array further comprises a plurality of sense amplifier circuits arranged alternately with the plurality of sub memory cell arrays and each comprising a first amplifier configured to amplify one of the first bitline and the second bitline to a first voltage level in response to a first sensing control signal, and a second amplifier configured to amplify one of the first bitline and the second bitline to the first voltage level in response to a second sensing control signal. The power supply is configured to supply the first voltage to the plurality of sense amplifier circuits. The controller is configured to determine an activation order of the first sensing control signal and the second sensing control signal according to an address, and to adjust a time interval between activation time points of the first and second sensing control signals input to each sense amplifier circuit according to a distance between the power supply and the sense amplifier circuit.

In certain embodiments, the controller further comprises a row decoder configured to decode the address to produce a row address and to activate the first or second wordline based on the row address.

In certain embodiments, the first amplifier comprises a first driver configured to receive the first voltage in response to the first sensing control signal, a second driver configured to drive the first bitline with the first voltage from the first driver in response to a signal on the second bitline, and a third driver configured to drive the second bitline with the first voltage from the first driver in response to a signal on the first bitline, the third driver having a greater current driving capability than the second driver.

In certain embodiments, the first, second and third drivers constitute metal oxide semiconductor transistors.

In certain embodiments, the second amplifier comprises a fourth driver configured to receive the first voltage in response to the second sensing control signal, a fifth driver configured to drive the second bitline with the first voltage from the fourth driver in response to a signal on the first bitline, and a sixth driver configured to drive the first bitline with the first voltage from the fourth driver in response to a signal on the second bitline, the sixth driver having a greater driving ability than the fifth driver.

In certain embodiments, the sense amplifier circuit further comprises a third amplifier configured to amplify one of the first bitline and the second bitline to a second voltage level.

In certain embodiments, the controller activates the first sensing control signal before activating the second sensing control signal where the first wordline is activated, and activates the second sensing control signal before activating the first sensing control signal where the second wordline is activated.

In certain embodiments, the controller increases the time interval between the activation time points of the first and second sensing control signals where the sense amplifier circuit is located farther away from the power supply.

In certain embodiments, the controller decreases the time interval between the activation time points of the first and second sensing control signals where the sense amplifier circuit is located closer to the power supply.

In certain embodiments, the controller comprises a sensing control signal generator comprising a delay circuit configured to receive an active command and first and second sense amplifier enable signals activated at different times separated by a predetermined delay, and in response to receiving the active command, delay the second sense amplifier enable signal, and generate a plurality of delay signals with sequentially delayed activation time points, and a driving circuit configured to sequentially output the first sense amplifier enable signal and the delay signal as the first sensing control signal and the second sensing control signal where the first wordline is activated, and sequentially output the first sense amplifier enable signal and the delay signal as the second sensing control signal and the first sensing control signal where the second wordline is activated.

In certain embodiments, the driving circuit comprises a first logic unit configured to activate the first sensing control signal in response to the first sense amplifier enable signal where the first wordline is activated, and configured to activate the first sensing control signal in response to the delay signal where the second wordline is activated, and a second logic unit configured to activate the second sensing control signal in response to the first sense amplifier enable signal where the second wordline is activated and, configured to activate the second sensing control signal in response to the delay signal where the first wordline is activated.

In certain embodiments, the memory cell array comprises a dynamic random access memory cell array.

According to another embodiment of the inventive concept, a semiconductor memory device comprises a plurality of memory cell arrays and a plurality of sense amplifiers arranged in an alternating configuration, the sense amplifiers configured to amplify signals on bitlines connected to the memory cell arrays in response to activation of corresponding sensing control signals. The semiconductor memory device further comprises a power supply providing a power supply voltage to the sense amplifiers, and a controller configured to delay activation of one of the sensing control signals relative to another one of the sensing control signals according to a distance between the power supply and the controller.

In certain embodiments, one or more of the bitlines constitutes a pair of signal lines, and the sense amplifiers amplify a difference between signals on the pairs of signal lines.

In certain embodiments, the controller increases the delay between activation of the sensing control signals based on an increase in the distance between the power supply and the sense amplifiers.

BRIEF DESCRIPTION OF THE DRAWINGS

Embodiments of the inventive concept will be more clearly understood from the following detailed description taken in conjunction with the accompanying drawings. In the drawings, like reference numerals denote like features.

DETAILED DESCRIPTION OF THE EMBODIMENTS

Various embodiments will be described more fully hereinafter with reference to the accompanying drawings. The inventive concept may, however, be embodied in many different forms and should not be construed as being limited to only the illustrated embodiments. Rather, these embodiments are presented as teaching examples.

Figure 1:
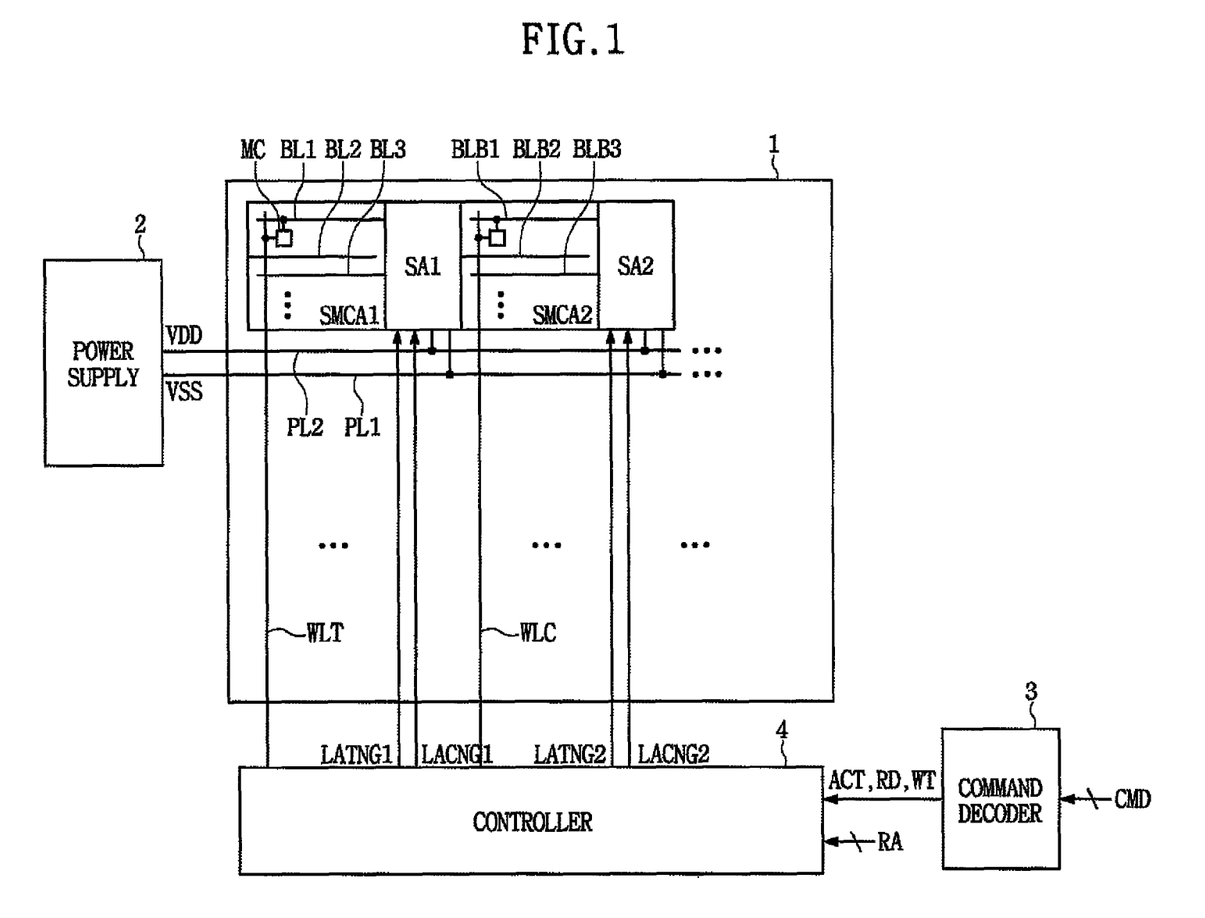
FIG. 1 is a block diagram of a semiconductor memory device according to an embodiment of the inventive concept.

FIG. 1 is a block diagram of a semiconductor memory device according to an embodiment of the inventive concept.

Referring to FIG. 1, the semiconductor memory device of this embodiment comprises a memory cell array 1, a power supply 2, a command decoder 3, and a controller 4.

Memory cell array 1 comprises a plurality of sub memory cell arrays SMCA1 and SMCA2 arranged in a bitline direction, and a plurality of sense amplifier circuits SA1 and SA2 arranged adjacent to sub memory cell arrays SMCA1 and SMCA2, respectively.

Sub memory cell array SMCA1 comprises a plurality of memory cells MC connected to a plurality of first wordlines WLT and a plurality of first bitlines BL1, BL2, and BL3. Sub memory cell array SMCA2 comprises a plurality of memory cells MC connected to a plurality of second wordlines WLC and a plurality of second bitlines BLB1, BLB2, and BLB3.

Power supply 2 provides a supply voltage VDD and a ground voltage VSS to sense amplifier circuits SA1 and SA2, which sense and amplify data on bitline pairs of odd-numbered first bitlines BL1 and BL3 of sub memory cell array SMCA1 and even-numbered second bitline BLB2 of sub memory cell array SMCA2 in response to corresponding first sensing control signals LATNG1 and LATNG2 and second sensing control signals LACNG1 and LACNG2.

Power supply 2 is located at one side of memory cell array 1 in the bitline direction, and applies ground voltage VSS and supply voltage VDD to sense amplifier circuits SA1 and SA2 via a first power line PL1 and a second power line PL2. First and second sense amplifier circuits SA1 and SA2 amplify data on bitline pairs (BL, BLB) to supply voltage VDD or ground voltage VSS.

Command decoder 3 decodes an external command signal CMD and activates an active command ACT, a read command RD, or a write command WT.

Controller 4 decodes a row address RA to activate one of first wordlines WLT and second wordlines WLC, and activates first sensing control signals LATNG1 and LATNG2 and second sensing control signals LACNG1 and LACNG2 in response to first and second sense amplifier enable signals PNST and PNSC. The first and second sensing control signals are activated with a timing that depends on whether the first or second wordlines WLT or WLC are activated. For instance, where first wordlines WLT are activated, first sensing control signals LATNG1 and LATNG2 are activated before second sensing control signals LACNG1 and LACNG2, and where second wordlines WLC are activated, second sensing control signals LACNG1 and LACNG2 are activated before first sensing control signals LATNG1 and LATNG2.

Although not shown in FIG. 1, where active command ACT is activated, controller 4 generates first sense amplifier enable signal PNST and second sense amplifier enable signal PNSC. First sense amplifier enable signal PNST and second sense amplifier enable signal PNSC are activated at different times separated by a predetermined time interval.

First sensing control signals LATNG1 and LATNG2 and second sensing control signals LACNG1 and LACNG2 are activated at different times separated by a time interval based on the predetermined time separating first and second sense amplifier enable signals PNST and PNSC. Additionally, the time interval between the first and second sensing control signals is adjusted according to a distance between power supply 2 and each of sense amplifier circuits SA1 and SA2. In particular, as the distance between power supply 2 and each of sense amplifier circuits SA1 and SA2 increases, the time interval between the activation times of first sensing control signals LATNG1 and LATNG2 and second sensing control signals LACNG1 and LACNG2 input to corresponding sense amplifier circuits SA1 and SA2 increases.

Controller 4 outputs first sensing control signals LATNG1 and LATNG2 and second sensing control signals LACNG1 and LACNG2 with the time interval adjusted according to the distance between power supply 2 and each of sense amplifier circuits SA1 and SA2. Controller 4 also controls operations of sense amplifier circuits SA1 and SA2.

Although not shown in FIG. 1, controller 4 typically comprises a row decoder configured to decode row address RA to activate one of first wordlines WLT and second wordlines WLC. In the example of FIG. 1, memory cell array 1 has an open bitline configuration. However, this configuration could be modified in other embodiments.

Figure 2:
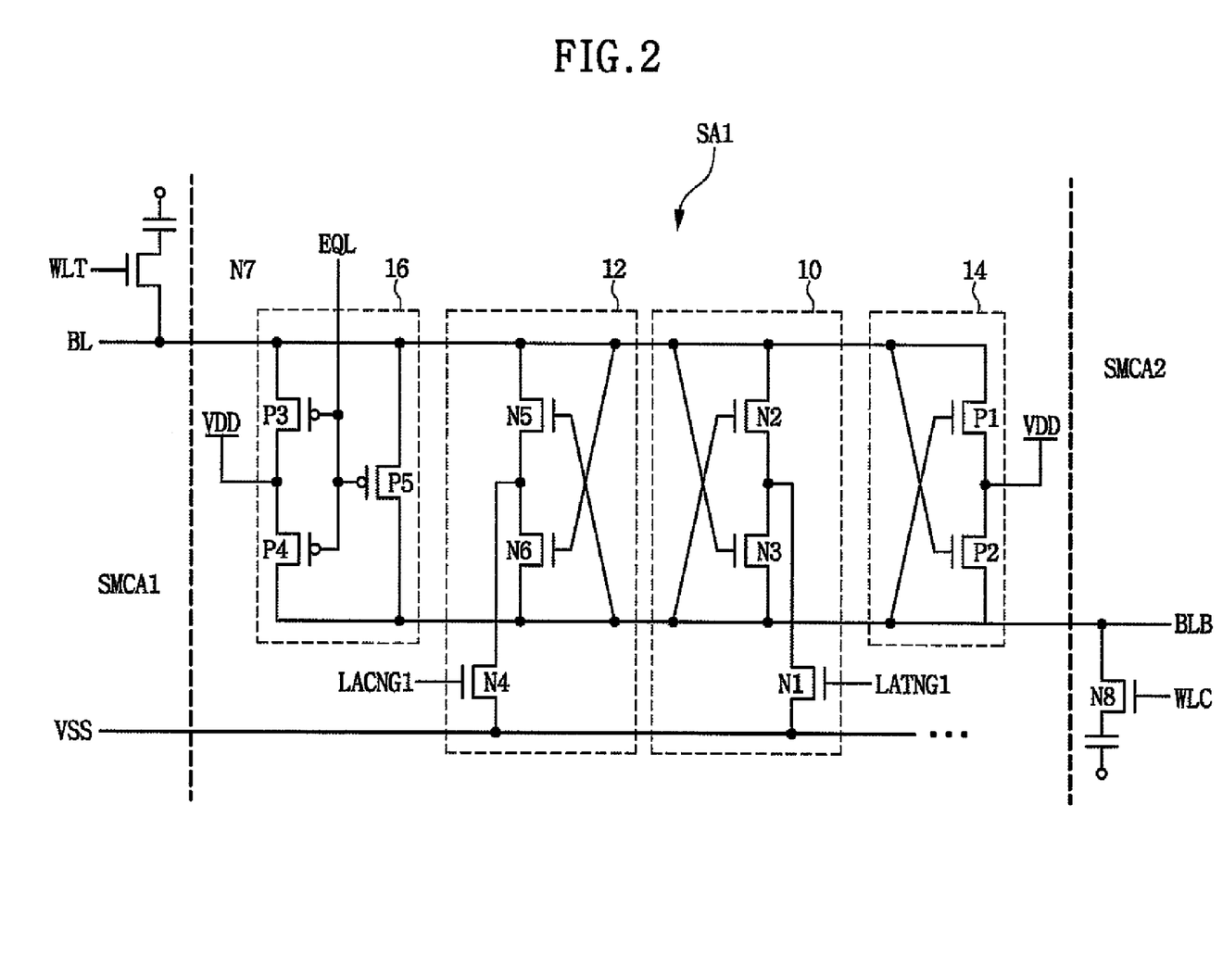
FIG. 2 is a circuit diagram of a first sense amplifier circuit of FIG. 1.

FIG. 2 is a circuit diagram of an embodiment of first sense amplifier circuit SA1. In this embodiment, first sense amplifier circuit SA1 comprises a first amplifier 10, a second amplifier 12, a third amplifier 14, and an equalizer 16.

First amplifier 10 comprises an NMOS transistor N1 for receiving ground voltage VSS via first power line PL1 in response to first sensing control signal LATNG1, an NMOS transistor N2 for connecting first bitline BL to ground voltage VSS via NMOS transistor N1 in response to a signal on second bitline BLB, and an NMOS transistor N3 for connecting second bitline BLB with ground voltage VSS via NMOS transistor N2 in response to a signal on first bitline BL. Accordingly, first amplifier 10 connects first bitline BL or second bitline BLB to ground voltage VSS in response to activation of first sensing control signal LATNG1. In this embodiment, NMOS transistor N3 has a larger channel size than NMOS transistor N2.

Second amplifier 12 comprises an NMOS transistor N5 for receiving ground voltage VSS via first power line PL1 in response to second sensing control signal LACNG1, an NMOS transistor N6 for connecting first bitline BL with ground voltage VSS via NMOS transistor N5 in response to the signal on second bitline BLB, and an NMOS transistor N7 for connecting second bitline BLB to ground voltage VSS via NMOS transistor N7 in response to the signal on first bitline BL. Accordingly, second amplifier 12 connects first bitline BL or second bitline BLB to ground voltage VSS in response to activation of second sensing control signal LACNG1. In this embodiment, NMOS transistor N5 has a larger channel size than NMOS transistor N6.

Third amplifier 14 comprises a PMOS transistor P1 for connecting first bitline BL to supply voltage VDD in response to the signal on second bitline BLB, and a PMOS transistor P2 for connecting second bitline BLB to supply voltage VDD in response to the signal on first bitline BL. Accordingly, third amplifier 14 connects first bitline BL or second bitline BLB to supply voltage VDD.

Equalizer 16 comprises a plurality of PMOS transistors P3, P4, and P5 for equally precharging first bitline BL and second bitline BLB to supply voltage VDD in response to an equalizing signal EQL. Here, equalizing signal EQL is activated during a standby period and deactivated during an active period.

Sense amplifier circuit SA2 may be implemented with a similar configuration as first sense amplifier circuit SA1, and therefore a detailed description of sense amplifier circuit SA2 will be omitted to avoid redundancy.

The operation of first sense amplifier circuit SA1 will be described below for instances where different values of data are applied to bitline BL. In the description that follows, it is assumed that the bitline pair (BL, BLB) shown in FIG. 2 is initially precharged to supply voltage VDD, and first wordline WLT is activated based on row address RA.

The operation of first sense amplifier circuit SA1 will first be described with reference to an example where the data in the selected memory cell MC is '0'.

Upon activation of first wordline WLT, bitline BL connected to a selected memory cell MC has a lower voltage level than supply voltage VDD due to charge sharing with other memory cells MC. Second bitline BLB remains at the voltage level of supply voltage VDD while first wordline WLT is activated such that the bitline pair (BL, BLB) has a small voltage difference.

Where first sensing control signal LATNG1 is activated, NMOS transistor N1 of first amplifier 10 applies ground voltage VSS from first power line PL1 to sources of NMOS transistor N2 and NMOS transistor N3 in response to first sensing control signal LATNG1. NMOS transistor N2 connects first bitline BL to ground voltage VSS in response to a signal on second bitline BLB, and NMOS transistor N3 connects second bitline BLB to ground voltage VSS in response to a signal on first bitline BL. In this case, since the voltage level of second bitline BLB is slightly higher than that of bitline BL, second bitline BLB suffers from a faster charge discharge than bitline BL.

Where second sensing control signal LACNG1 is activated, NMOS transistor N5 of second amplifier 12 connects first bitline BL to ground voltage VSS in response to the signal on second bitline BLB, and NMOS transistor N6 connects second bitline BLB to ground voltage VSS in response to the signal on first bitline BL. Here, since NMOS transistor N5 has a larger channel size than NMOS transistor N6, second bitline BLB discharges more quickly than first bitline BL. Meanwhile, the PMOS transistor P2 of third amplifier 14 connects second bitline BLB to supply voltage VDD in response to the signal on first bitline BL. That is, since first bitline BL is connected to ground voltage VSS by first and second amplifiers 10 and 12, and second bitline BLB is connected to supply voltage VDD by third amplifier 14, the data in the bitline pair (BL, BLB) is amplified to '0'.

However, as first sense amplifier circuit SA1 becomes located more close to power supply 2, strong discharge occurs through NMOS transistor N1 of first amplifier 10. Since the current driving ability of NMOS transistor N3 is greater than that of NMOS transistor N2, charge discharges through NMOS transistor N3 more quickly than through NMOS transistor N2. Consequently, it is possible that the voltage levels of first bitline BL and second bitline BLB may be reversed to change the polarity of data, and therefore the time interval between the activation time point of first sensing control signal LATNG1 and the activation time point of second sensing control signal LACNG1 is adjusted to a small value to advance the operation start time point of second amplifier 12 after first amplifier 10 begins to operate.

Due to this adjustment, NMOS transistor N5, which has a greater current driving capacity than other transistors in second amplifier 12, connects first bitline BL with ground voltage VSS to prevent the data on the bitline pair (BL, BLB) from changing polarity before the voltage level of second bitline BLB is lower than the voltage level of first bitline BL due to charge discharge through NMOS transistor N3.

The operation of first sense amplifier circuit SA1 will first be described with reference to an example where the data in the selected memory cell MC is '1'.

In this example, both first bitline BL and second bitline BLB remain at the level of supply voltage VDD even after first wordline WLT is activated. Where first sensing control signal LATNG1 is activated, NMOS transistor N1 of first amplifier 10 applies ground voltage VSS from first power line PL1 to the sources of NMOS transistor N2 and NMOS transistor N3 in response to first sensing control signal LATNG1. NMOS transistor N2 connects first bitline BL to ground voltage VSS in response to the signal on second bitline BLB, and NMOS transistor N3 connects second bitline BLB to ground voltage VSS in response to the signal on first bitline BL. Here, the same voltage level is applied to the gates of NMOS transistors N2 and N3. However, since the current driving ability of NMOS transistor N3 is greater than that of NMOS transistor N2, second bitline BLB discharges more quickly than first bitline BL. As a result, the voltage level of second bitline BLB becomes lower than that of first bitline BL.

Where second sensing control signal LACNG1 is activated, NMOS transistor N6 of second amplifier 12 connects second bitline BLB to ground voltage VSS in response to the signal on first bitline BL, and the PMOS transistor P1 of third amplifier 14 connects first bitline BL to supply voltage VDD in response to the signal on second bitline BLB. That is, since first bitline BL is connected to supply voltage VDD by third amplifier 14 and second bitline BLB is connected to ground voltage VSS by first and second amplifiers 10 and 12, the data on the bitline pair (BL, BLB) is amplified to '1'.

However, where first sense amplifier circuit SA1 becomes located farther away from power supply 2, weak charge discharge through NMOS transistor N1 of first amplifier 10 may occur, causing the discharge speeds of first bitline BL and second bitline BLB to be reduced such that the voltage level of second bitline BLB does not sufficiently decrease. Accordingly, if second amplifier 12 begins to operate where a voltage difference between first bitline BL and second bitline BLB is small, it is possible that the voltage levels of first bitline BL and second bitline BLB will become reversed to change the data polarity due to the connection between NMOS transistor N5 and ground voltage VSS. In this case, the time interval between the activation of first sensing control signal LATNG1 and the activation of second sensing control signal LACNG1 is adjusted to a greater value to delay the operation start time point of second amplifier 12 after first amplifier 10 begins to operate. Accordingly, a time is gained to make the voltage difference between second bitline BLB and first bitline BL sufficiently large before second amplifier 12 operates, such that the polarity of data on the bitline pair (BL, BLB) is not changed.

As indicated above, as the sense amplifier circuit moves farther away from power supply 2, the operation start time point of second amplifier 12 after first amplifier 10 begins to operate is delayed to reduce the possibility of a change of polarity of data on the bitline pair (BL, BLB) of the selected memory cell MC. On the other hand, as the sense amplifier circuit moves closer to power supply 2, the operation start time point of second amplifier 12 after first amplifier 10 begins to operate is advanced to reduce the possibility of change of polarity of data on the bitline pair (BL, BLB). To facilitate these timing adjustments, controller 4 comprises a sensing control signal generator configured to adjust the time interval between the activation time point of first sensing control signal LATNG2 and the activation time point of second sensing control signal LACNG2. The configuration of the sensing control signal generator is described in further detail below.

Figure 3:
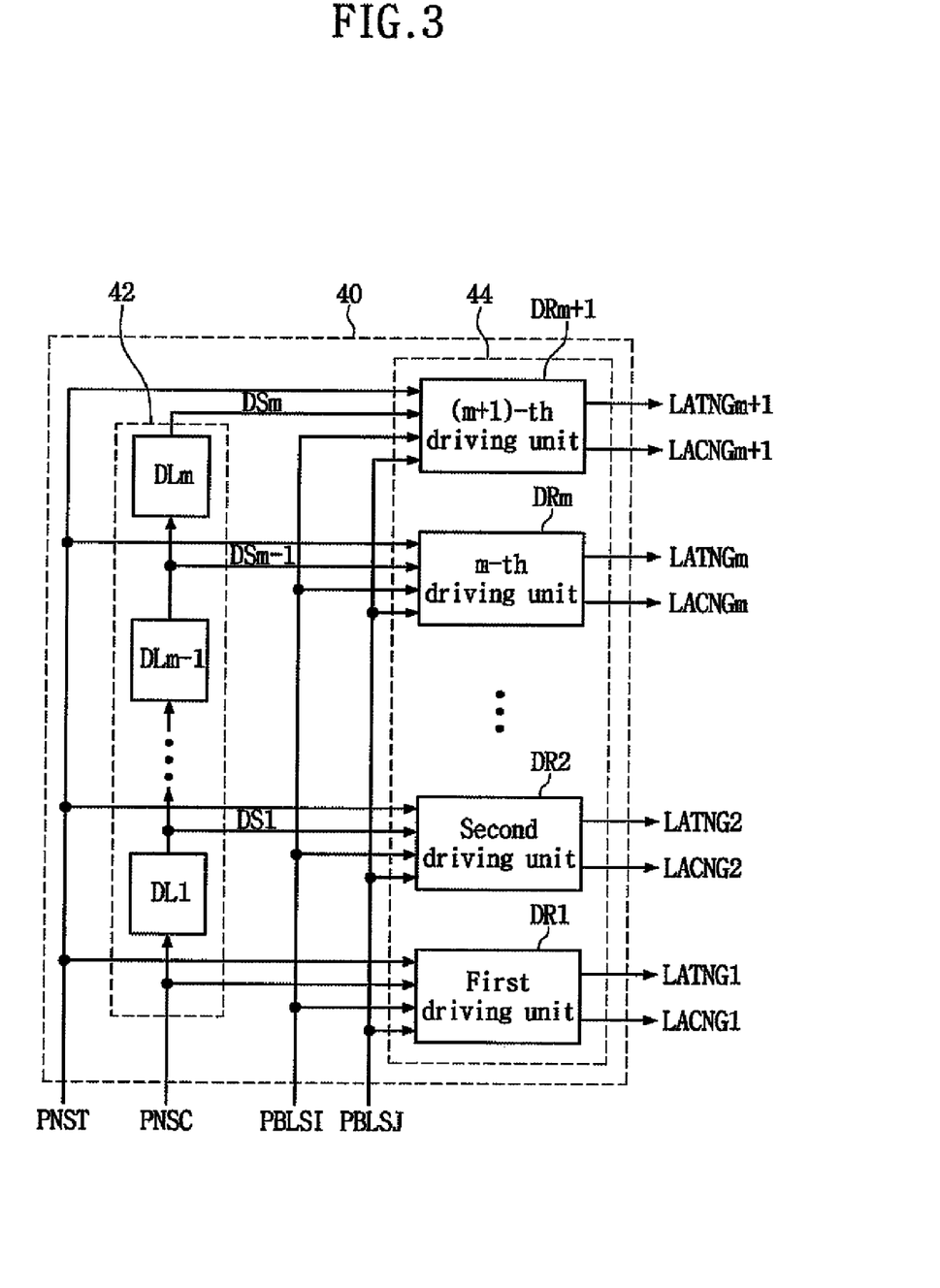
FIG. 3 is a block diagram of a sensing control signal generator in a controller of FIG. 1.

FIG. 3 is a block diagram of the sensing control signal generator in the controller in FIG. 1. Referring to FIG. 3, the sensing control signal generator in controller 4 comprises a delay circuit 42 and a driving circuit 44.

Delay circuit 42 delays second sense amplifier enable signal PNSC to generate a plurality of delay signals DS1 through DSm whose activation time points are sequentially delayed. Delay circuit 42 comprises a plurality of delay units DL1 through DLm arranged in the arrangement direction of first and second sense amplifier circuits SA1 and SA2 in FIG. 1.

Driving circuit 44 determines an activation order of first sensing control signals LATNG1 through LATNGm+1 and second sensing control signals LACNG1 through LACNGm+1 according to a first block select signal PBLSI and a second block select signal PBLSJ. Additionally, driving circuit 44 adjusts a time interval between activation time points of first sensing control signals LATNG1 through LATNGm+1 and second sensing control signals LACNG1 through LACNGm+1 according to a time interval between the activation time points of first sense amplifier enable signal PNST and delay signals DS1 through DSm.

Because the delay amounts of delay signals DS1 through DSm generated by delay circuit 42 increase sequentially, the time interval between the activation time points of first sensing control signals LATNG1 through LATNGm+1 and second sensing control signals LACNG1 through LACNGm+1 generated by driving units DR1 through DRm+1 in driving circuit 44 gradually increases. Here, first block select signal PBLSI is activated where first wordline WLT is activated by row address RA, and second block select signal PBLSJ is activated where second wordline WLC is activated by row address RA.

In other words, driving circuit 44 sequentially generates first sensing control signals LATNG1 through LATNGm+1 and second sensing control signals LACNG1 through LACNGm+1 using first sense amplifier enable signal PNST and delay signals DS1 through DSm where first wordline WLT is activated, and sequentially generates second sensing control signals LACNG1 through LACNGm+1 and first sensing control signals LATNG1 through LATNGm+1 using first sense amplifier enable signal PNST and delay signals DS1 through DSm where second wordline WLC is activated.

Meanwhile, driving units DR1 through DRm+1 are arranged in an arrangement direction of first and second sense amplifier circuits SA1 and SA2 in FIG. 1.

Figure 4:
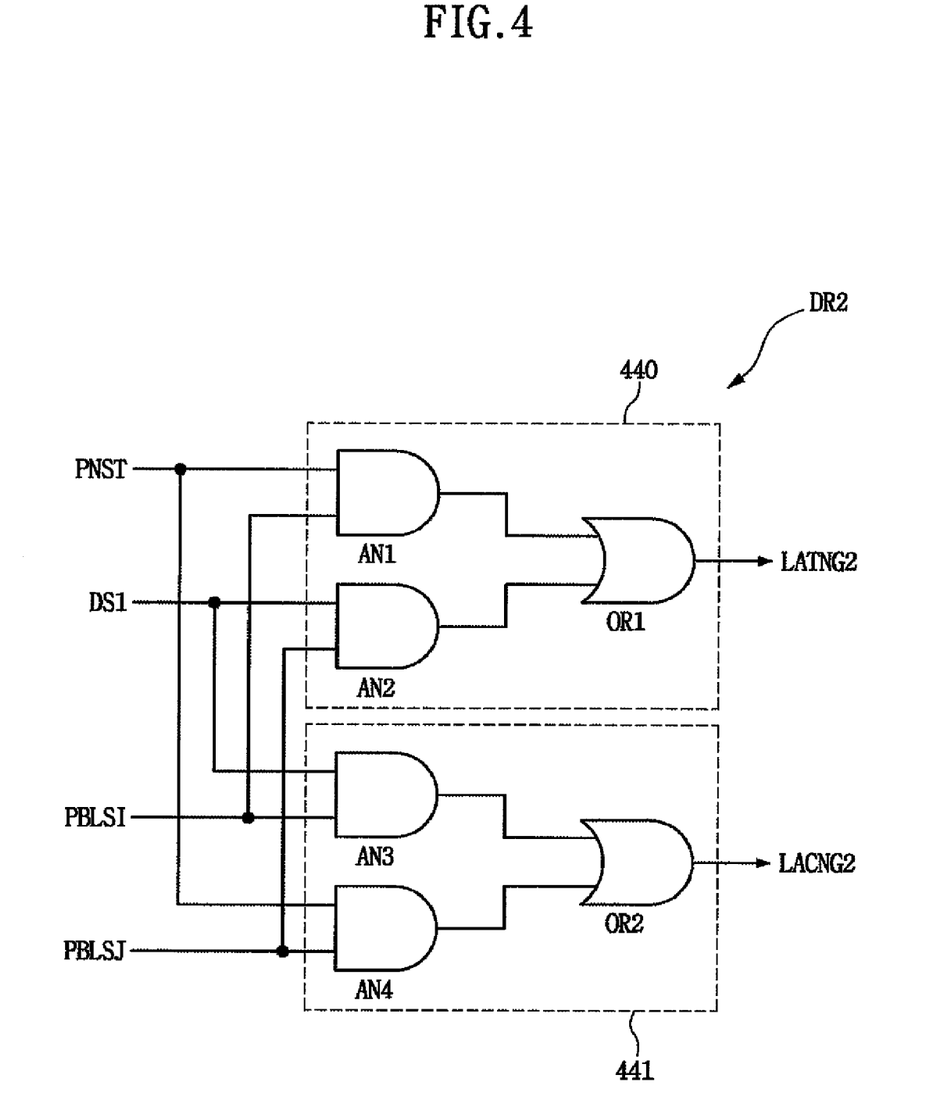
FIG. 4 is a circuit diagram of a second driving unit of FIG. 3.

FIG. 4 is a circuit diagram illustrating an embodiment of second driving unit DR2 in FIG. 3. In this embodiment, second driving unit DR2 comprises a first logic unit 440 and a second logic unit 441.

First logic unit 440 comprises an AND gate AN1 for performing an AND operation on first sense amplifier enable signal PNST and first block select signal PBLSI, an AND gate AN2 for performing an AND operation on first delay signal DS1 and second block select signal PBLSJ, and an OR gate OR1 for performing an OR operation on an output signal of AND gate AN1 and an output signal of AND gate AN2 to generate first sensing control signal LATNG2. Where first block select signal PBLSI is activated, first logic unit 440 activates first sensing control signal LATNG2 in response to first sense amplifier enable signal PNST.

Second logic unit 441 comprises an AND gate AN3 for performing an AND operation on first delay signal DS1 and first block select signal PBLSI, an AND gate AN4 for performing an AND operation on first sense amplifier enable signal PNST and second block select signal PBLSJ, and an OR gate OR2 for performing an OR operation on an output signal of AND gate AN3 and an output signal of AND gate AN4 to generate second sensing control signal LACNG2. Where second block select signal PBLSJ is activated, second logic unit 441 activates second sensing control signal LACNG2 in response to first sense amplifier enable signal PNST.

All driving units DR1 through DRm+1 may have the same configuration as the embodiment of driving unit DR2 illustrated in FIG. 4. Accordingly, a further description of the remaining driving units will be omitted to avoid redundancy.

Figure 5:
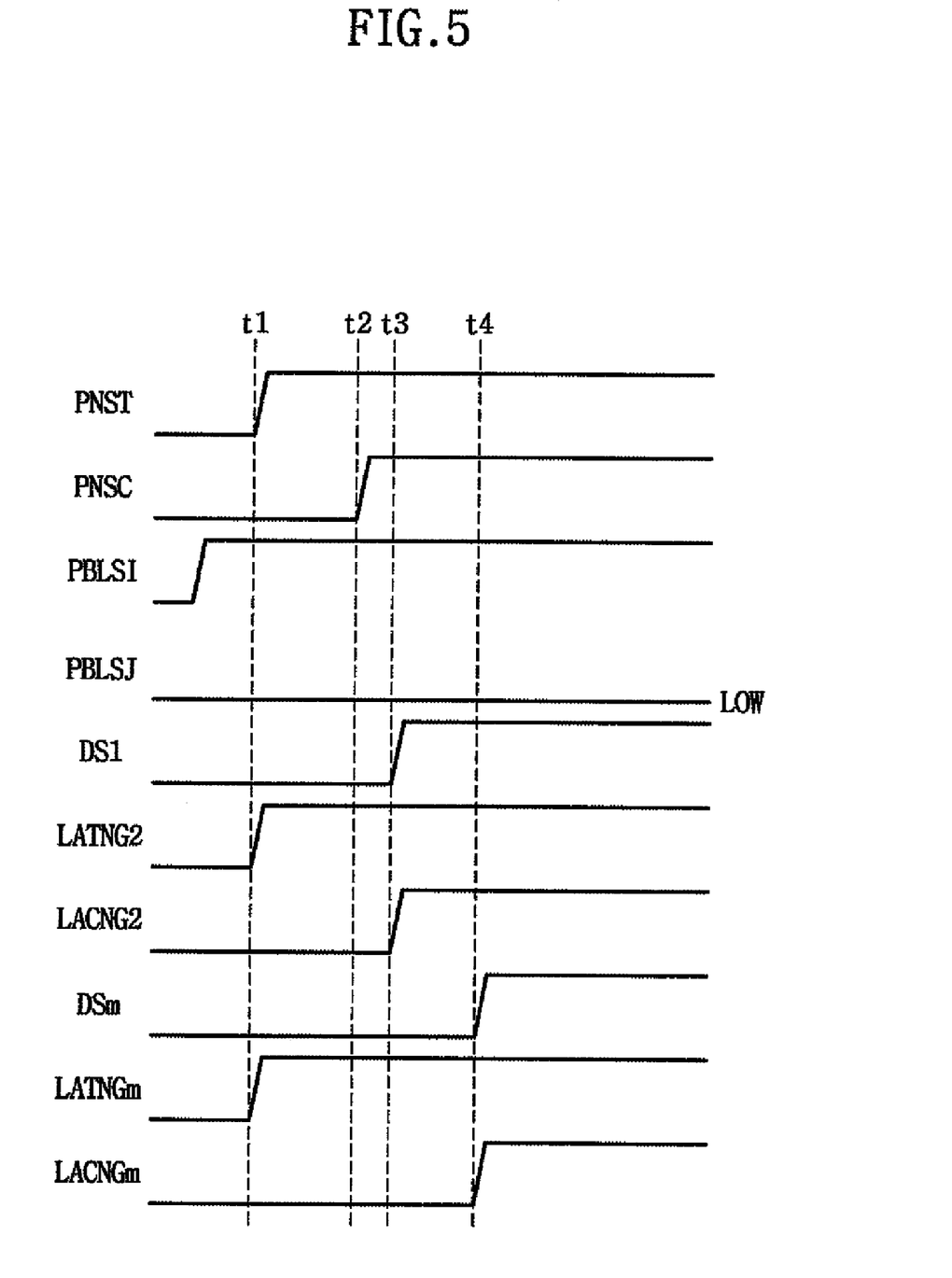
FIG. 5 is a timing diagram illustrating the operation of a sensing control signal generator of FIG. 3 where a first wordline is activated.

FIG. 5 is a timing diagram illustrating operation of the sensing control signal generator in FIG. 3 where the first wordline is activated.

Where first wordline WLT is activated, first block select signal PBLSI is activated and second block select signal PBLSJ is deactivated.

Where first sense amplifier enable signal PNST is activated at a time point t1, first logic unit 440 of second driving unit DR2 activates first sensing control signal LATNG2 in response to activation of first block select signal PBLSI and first sense amplifier enable signal PNST. Where second sense amplifier enable signal PNSC is activated at a time point t2, first delay unit DL1 delays second sense amplifier enable signal PNSC to output first delay signal DS1. At a time point t3, second logic unit 441 of second driving unit DR2 activates second sensing control signal LACNG2 in response to first block select signal PBLSI and first delay signal DS1. That is, second driving unit DR2 activates first and second sensing control signals LATNG2 and LACNG2 at t1 and t3 in response to first and second sense amplifier enable signals PNST and PNSC activated at t1 and t2.

Meanwhile, (m+1)-th driving unit DRm+1 also activates first sensing control signal LATNGm+1 in response to first sense amplifier enable signal PNST at time point t1. Where second sense amplifier enable signal PNSC is then activated, first through (m−1)-th delay units DL1 through DLm−1 sequentially delay second sense amplifier enable signal PNSC to generate a (m−1)-th delay signal DSm−1, and m-th delay unit DLm delays (m−1)-th delay signal DSm−1 to generate a m-th delay signal DSm. Driving unit DRm+1 activates second sensing control signal LACNGm+1 in response to first block select signal PBLSI and m-th delay signal DSm at a time point t4.

As indicated above, driving circuit 44 generates first and second sensing control signals LATNG1 through LATNGm+1 and LACNG1 through LACNGm+1, whose time intervals between activation time points gradually increases, in response to delay signals DS1 through DSm, whose activation time points are sequentially delayed. First and second sensing control signals LATNG1 through LATNGm+1 and LACNG1 through LACNGm+1 generated by driving circuit 44 are input to sense amplifier circuits SA1 and SA2, respectively.

Figure 6:
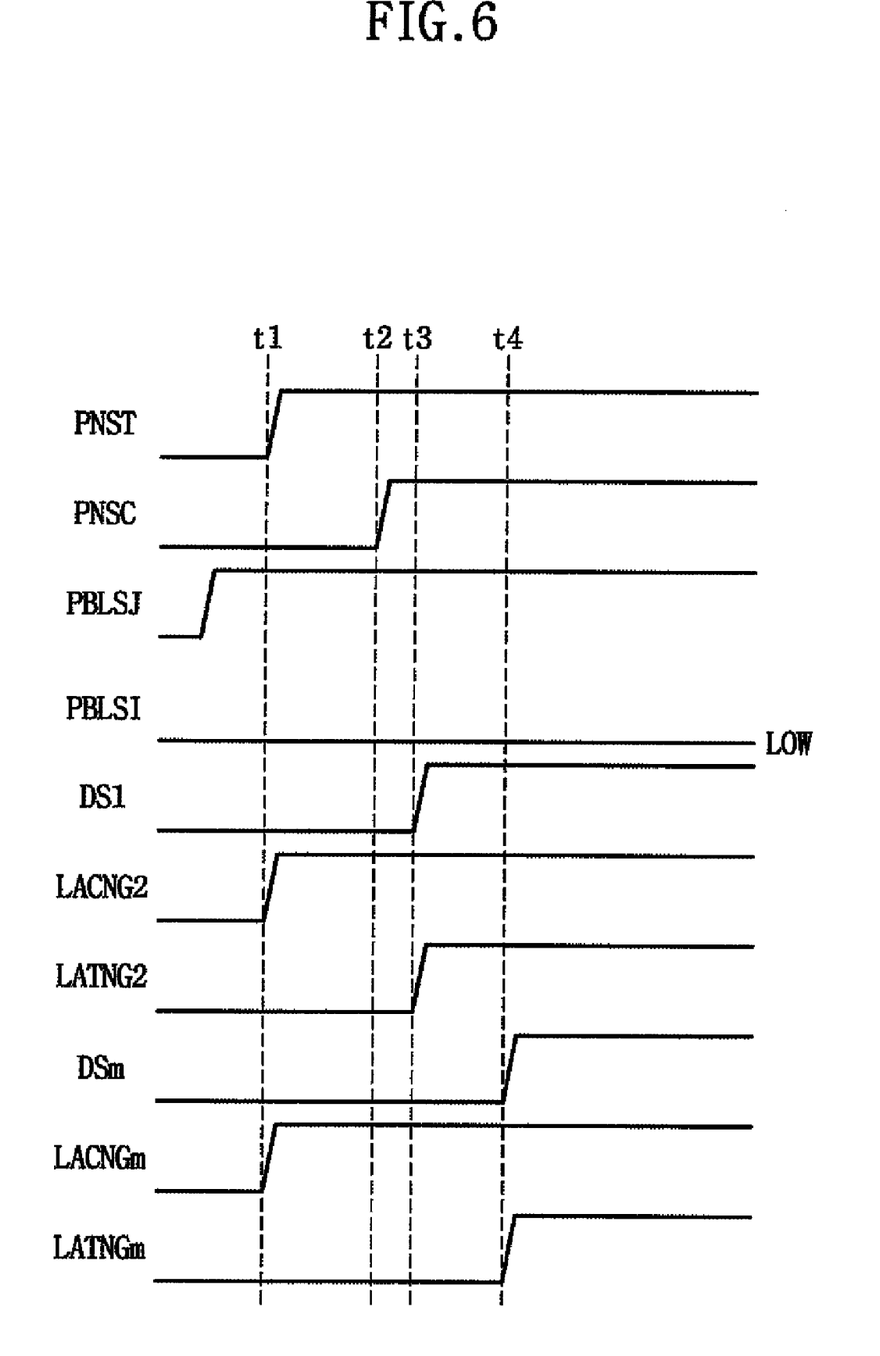
FIG. 6 is a timing diagram illustrating the operation of a sensing control signal generator of FIG. 3 where a second wordline is activated.

FIG. 6 is a timing diagram illustrating operation of the sensing control signal generator in FIG. 3 where the second wordline is activated. Where second wordline WLC is activated, first block select signal PBLSI is deactivated and second block select signal PBLSJ is activated.

Where first sense amplifier enable signal PNST is activated at a time point t1, second logic unit 441 of second driving unit DR2 generates second sensing control signal LACNG2 activated in response to second block select signal PBLSJ and first sense amplifier enable signal PNST. Where second sense amplifier enable signal PNSC is activated at a time point t2, first delay unit DL1 delays second sense amplifier enable signal PNSC to output first delay signal DS1. At a time point t3, first logic unit 440 of second driving unit DR2 generates second block select signal PBLSJ activated in response to first sensing control signal LATNG2 and first delay signal DS1. That is, second driving unit DR2 generates first and second sensing control signals LATNG2 and LACNG2 activated at t1 and t3 in response to first and second sense amplifier enable signals PNST and PNSC activated at t1 and t2.

Meanwhile, (m+1)-th driving unit DRm+1 activates second sensing control signal LACNGm+1 in response to first sense amplifier enable signal PNST at time point t1. Where second sense amplifier enable signal PNSC is then activated, first to (m−1)-th delay units DL1 through DLm−1 sequentially delay second sense amplifier enable signal PNSC to output a (m−1)-th delay signal DSm−1, and m-th delay unit DLm delays (m−1)-th delay signal DSm−1 to output a m-th delay signal DSm. At a time point t4, (m+1)-th driving unit DRm+1 generates a first sensing control signal LATNGm+1 activated in response to second block select signal PBLSJ and m-th delay signal DSm.

That is, driving circuit 44 generates first and second sensing control signals LATNG1 through LATNGm+1 and LACNG1 through LACNGm+1, whose time interval between activation time points gradually increases, in response to delay signals DS1 through DSm, whose activation time points are sequentially delayed. First and second sensing control signals LATNG1 through LATNGm+1 and LACNG1 through LACNGm+1 generated by driving circuit 44 are input to sense amplifier circuits SA1 and SA2, respectively.

As indicated above, the sensing control signal generator determines an activation order of first sensing control signals LATNG1 through LATNGm+1 and second sensing control signals LACNG1 through LACNGm+1, according to an activation state of first and second block select signals PBLSI and PBLSJ, and generates first sensing control signal LATNG1 through LATNGm+1 and second sensing control signals LACNG1 through LACNGm+1, whose time interval between activation time points sequentially increases, in response to first sense amplifier enable signal PNST and delay signals DS1 through DSm.

Thus, the semiconductor memory device of this embodiment can stably amplify data without reversing the voltage level of the bitline pair (BL, BLB) irrespective of a data value by increasing the time interval between the activation time points of first sensing control signals LATNG1 through LATNGm+1 and second sensing control signals LACNG1 through LACNGm+1 input to the sense amplifier circuit as the sense amplifier circuit is located farther from power supply 2.

Although in this embodiment of the inventive concept, the bitline pair (BL, BLB) is precharged to supply voltage VDD and two N-type amplifiers and one P-type amplifier are included, the bitline pair (BL, BLB) may be precharged to ground voltage VSS and two P-type amplifiers and one N-type amplifier may be included.

In a semiconductor memory device according to the above embodiments, an interval of operation time points of first and second amplifiers in sense amplifier circuit is adjusted according to the distance between the sense amplifier circuit and the power supply, such that voltage level reversal between bitlines in the pair can be prevented, and stabilized data amplification can be performed irrespective of the distance between the sense amplifier circuit and the power supply.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
a memory cell array, comprising:
   a plurality of sub memory cell arrays each comprising a plurality of first memory cells connected between a plurality of first wordlines and a plurality of first bitlines, and a plurality of second memory cells connected between a plurality of second wordlines and a plurality of second bitlines, wherein the plurality of sub memory cells are arranged in a direction of the first bitlines; and
   a plurality of sense amplifier circuits arranged alternately with the plurality of sub memory cell arrays and each comprising a first amplifier configured to amplify one of the first bitline and the second bitline to a first voltage level in response to a first sensing control signal, and a second amplifier configured to amplify one of the first bitline and the second bitline to the first voltage level in response to a second sensing control signal;
a power supply configured to supply the first voltage to the plurality of sense amplifier circuits; and
a controller configured to determine an activation order of the first sensing control signal and the second sensing control signal according to an address, and to adjust a time interval between activation time points of the first and second sensing control signals input to each sense amplifier circuit according to a distance between the power supply and the sense amplifier circuit.

2. The semiconductor memory device of claim 1, wherein the controller further comprises a row decoder configured to decode the address to produce a row address and to activate the first or second wordline based on the row address.

3. The semiconductor memory device of claim 1, wherein the first amplifier comprises:
a first driver configured to receive the first voltage in response to the first sensing control signal;
a second driver configured to drive the first bitline with the first voltage from the first driver in response to a signal on the second bitline; and
a third driver configured to drive the second bitline with the first voltage from the first driver in response to a signal on the first bitline, the third driver having a greater current driving capability than the second driver.

4. The semiconductor memory device of claim 3, wherein the first, second and third drivers constitute metal oxide semiconductor transistors.

5. The semiconductor memory device of claim 1, wherein the second amplifier comprises:
a fourth driver configured to receive the first voltage in response to the second sensing control signal;
a fifth driver configured to drive the second bitline with the first voltage from the fourth driver in response to a signal on the first bitline; and
a sixth driver configured to drive the first bitline with the first voltage from the fourth driver in response to a signal on the second bitline, the sixth driver having a greater driving ability than the fifth driver.

6. The semiconductor memory device of claim 1, wherein the sense amplifier circuit further comprises a third amplifier configured to amplify one of the first bitline and the second bitline to a second voltage level.

7. The semiconductor memory device of claim 1, wherein the controller activates the first sensing control signal before activating the second sensing control signal where the first wordline is activated, and activates the second sensing control signal before activating the first sensing control signal where the second wordline is activated.

8. The semiconductor memory device of claim 1, wherein the controller increases the time interval between the activation time points of the first and second sensing control signals where the sense amplifier circuit is located farther away from the power supply.

9. The semiconductor memory device of claim 1, wherein the controller decreases the time interval between the activation time points of the first and second sensing control signals where the sense amplifier circuit is located closer to the power supply.

10. The semiconductor memory device of claim 1, wherein the controller comprises a sensing control signal generator comprising:
a delay circuit configured to receive an active command and first and second sense amplifier enable signals activated at different times separated by a predetermined delay, and in response to receiving the active command, delay the second sense amplifier enable signal, and generate a plurality of delay signals with sequentially delayed activation time points; and
a driving circuit configured to sequentially output the first sense amplifier enable signal and the delay signal as the first sensing control signal and the second sensing control signal where the first wordline is activated, and sequentially output the first sense amplifier enable signal and the delay signal as the second sensing control signal and the first sensing control signal where the second wordline is activated.

11. The device of claim 10, wherein the driving circuit comprises:
a first logic unit configured to activate the first sensing control signal in response to the first sense amplifier enable signal where the first wordline is activated, and configured to activate the first sensing control signal in response to the delay signal where the second wordline is activated; and
a second logic unit configured to activate the second sensing control signal in response to the first sense amplifier enable signal where the second wordline is activated and, configured to activate the second sensing control signal in response to the delay signal where the first wordline is activated.

12. The semiconductor memory device of claim 1, wherein the memory cell array comprises a dynamic random access memory cell array.

13. A semiconductor memory device, comprising:
a plurality of memory cell arrays and a plurality of sense amplifiers arranged in an alternating configuration, the sense amplifiers configured to amplify signals on bitlines connected to the memory cell arrays in response to activation of corresponding sensing control signals;
a power supply providing a power supply voltage to the sense amplifiers; and a controller configured to delay activation of one of the sensing control signals relative to another one of the sensing control signals according to a distance between the power supply and the controller.

14. The semiconductor memory device of claim 13, wherein one or more of the bitlines constitutes a pair of signal lines, and the sense amplifiers amplify a difference between signals on the pairs of signal lines.

15. The semiconductor memory device of claim 13, wherein the controller increases the delay between activation of the sensing control signals based on an increase in the distance between the power supply and the sense amplifiers.

* * * * *